(12) United States Patent
Kinoshita (10) Patent No.: US 6,498,889 B2
(45) Date of Patent: Dec. 24, 2002

(54) WAVEGUIDE OPTICAL DEVICE AND METHOD OF FABRICATING THE SAME

(75) Inventor: Junichi Kinoshita, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/819,224

(22) Filed: Mar. 27, 2001

(65) Prior Publication Data

US 2001/0026672 A1 Oct. 4, 2001

(30) Foreign Application Priority Data

Mar. 28, 2000 (JP) .......................................... 2000-088992

(51) Int. Cl.⁷ ................................................. G02B 6/10
(52) U.S. Cl. ......................................... 385/131; 385/130
(58) Field of Search ................................ 385/129, 130, 385/131, 132; 372/45, 46, 50

(56) References Cited

U.S. PATENT DOCUMENTS

| | | | |
|---|---|---|---|
| 4,870,468 A | | 9/1989 | Kinoshita et al. ......... 372/46 X |
| 4,958,202 A | | 9/1990 | Kinoshita et al. ......... 372/46 X |
| 5,781,577 A | * | 7/1998 | Nagai et al. .................. 372/46 |
| 6,150,667 A | * | 11/2000 | Ishizaka et al. ............. 385/8 X |

* cited by examiner

Primary Examiner—Phan T. H. Palmer
(74) Attorney, Agent, or Firm—Hogan & Hartson, LLP (57) ABSTRACT

First and second thin-film layers having different compositions are inserted between cladding layers to be stepped, and steps corresponding to a difference between the side etching amounts of these layers are formed. In this manner, symmetrical steps of about 0.5 μm can be reliably and easily formed on the side surfaces of a ridge waveguide.

16 Claims, 9 Drawing Sheets

WAVEGUIDE OPTICAL DEVICE AND METHOD OF FABRICATING THE SAME

CROSS REFERENCE TO RELATED APPLICATIONS

This application claims benefit of priority under 35 USC §119 to Japanese Patent Application No. 2000-88992, filed on Mar. 28, 2000 in Japan, the entire contents of which are incorporated by reference herein.

BACKGROUND OF THE INVENTION

The present invention relates to a waveguide optical device and method of fabricating the same. More specifically, the present invention relates to a waveguide optical device having a stepped ridge waveguide on the side surfaces of which steps of about 0.5 µm are symmetrically formed, and capable of being easily and reliably fabricated, and to a method of fabricating the same.

Examples of an optical device having a waveguide for guiding light are a light-emitting device such as a semiconductor laser, an optical modulator, and a light-detecting device (receiver) such as a waveguide photodiode. As this waveguide, a structure called "ridge" is known. In the case of a semiconductor laser having a double-hetero structure including a cladding layer/core layer/cladding layer, for example, this laser has a stripe waveguide so fabricated that the cladding layer above the active layer has a convex section. In a waveguide of this type, the stripe portion including the active layer below the ridge formed in the cladding layer functions as a waveguide to guide light.

Although such a waveguide is sometimes called "rib" or "strip load", these waveguides are generally called "ridge waveguides" in this specification.

Figure 9:
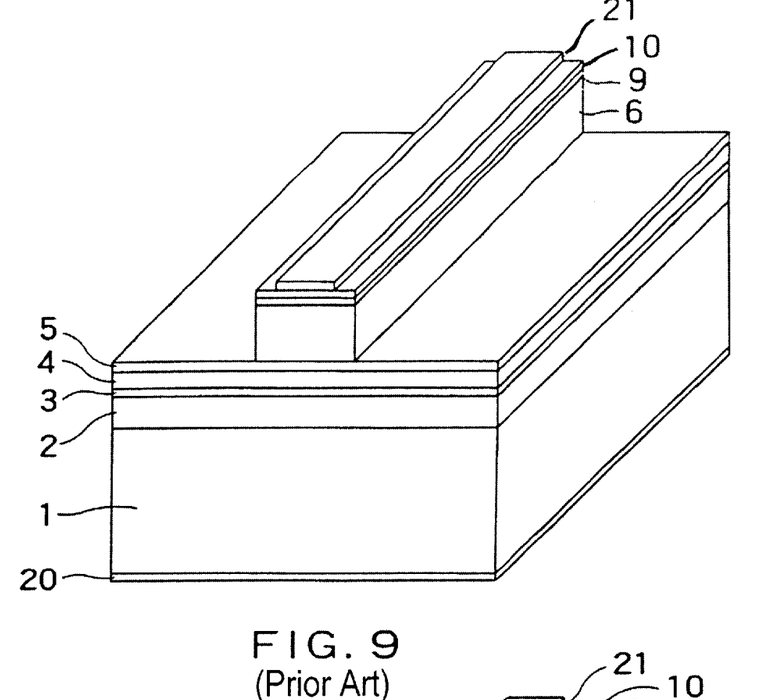
FIG. 9 is a perspective view showing a typical structure of a ridge waveguide semiconductor laser relevant to the present invention.

FIG. 9 is a perspective view showing a typical structure of a ridge waveguide semiconductor laser relevant to the present invention. That is, this laser shown in FIG. 9 is an InGaAsP/InP-based semiconductor laser used in the field of long-distance, high-speed optical communications. The construction of this laser will be described below following the fabrication procedure.

First, an n-InP lower cladding layer 2, an InGaAsP waveguide core layer/active layer 3 (about 0.1 µm thick) having an MQW (multiple-quantum well) structure, a p-InP first upper cladding layer 4 (about 0.15 µm thick), a p-InGaAsP etching stop layer 5 (about 0.05 µm thick), a p-InP second upper cladding layer 6 (about 1.3 µm thick), a p-InGaAsP barrier buffer layer 9 (about 0.04 µm thick), and a p$^+$-InGaAs contact layer 10 (about 0.1 µm thick) are formed flat by crystal growth on an n-type (100) InP substrate 1. The barrier buffer layer 9 is formed to buffer the rectification properties by the barrier between the p$^+$-InGaAs contact layer 10 and the p-InP second upper cladding layer 6. This barrier buffer layer 9 has a bandgap corresponding to a wavelength of 1.3 µm which is an intermediate composition between these layers 6 and 10.

Subsequently, a sulfuric acid-based etchant (e.g., 4 sulfuric acid+1 hydrogen peroxide+1 water) is used to etch away the p-InGaAsP barrier buffer layer 9 and the p$^+$-InGaAs contact layer 10 so as to leave a stripe portion about 2 µm wide behind.

These layers are used as masks to perform etching by using a hydrochloric acid (HCl)-based etchant. Consequently, the p-InP second upper cladding layer 6 is substantially vertically etched down to the p-InGaAsP etching stop layer 5. Since the HCl-based etchant acts only on InP, this etching accurately stops at the etching stop layer 5. Accordingly, a ridge waveguide having a convex section can be formed.

One modification of the ridge waveguide as shown in FIG. 9 is a so-called "buried waveguide construction" in which a waveguide layer is formed into a stripe and a medium having a low refractive index is buried around the stripe. This buried waveguide structure can also guide light by a refractive index difference in the lateral direction of the ridge.

In an optical device using the ridge waveguide shown in FIG. 9, however, it is difficult to simultaneously control the junction capacitance and transverse mode stability of the ridge.

That is, when an optical device including this waveguide is used as a semiconductor laser or as an electro-absorption type optical modulator integrated monolitically with the laser, electrodes 20 and 21 must be formed on the upper and lower surfaces of the waveguide. Unfortunately, an electric current supplied to the device via these electrodes spreads in the lateral direction in the first upper cladding layer 4 in the lower portion of the ridge stripe. This results in insufficient current focus to the core layer/active layer 3 of the waveguide. As a result, a non-active current; increases, and the threshold current of the semiconductor laser increases.

Also, the junction capacitance increases because the active layer 3 exists in the lateral direction. When the junction capacitance increases, the device cannot be easily modulated at high speed any longer either as a laser or as a modulator. In particular, modulation at 10 Gbps (Gigabits per second) or more becomes difficult.

To avoid these problems, the thickness of the first upper cladding layer 4 can be decreased to zero. When this is the case, however, light spread in the lateral direction of the ridge becomes insufficient, and this makes the transverse mode of the waveguide unstable.

Another option is a "stepped ridge waveguide" in which a ridge is formed into the shape of a staircase.

Figure 10:
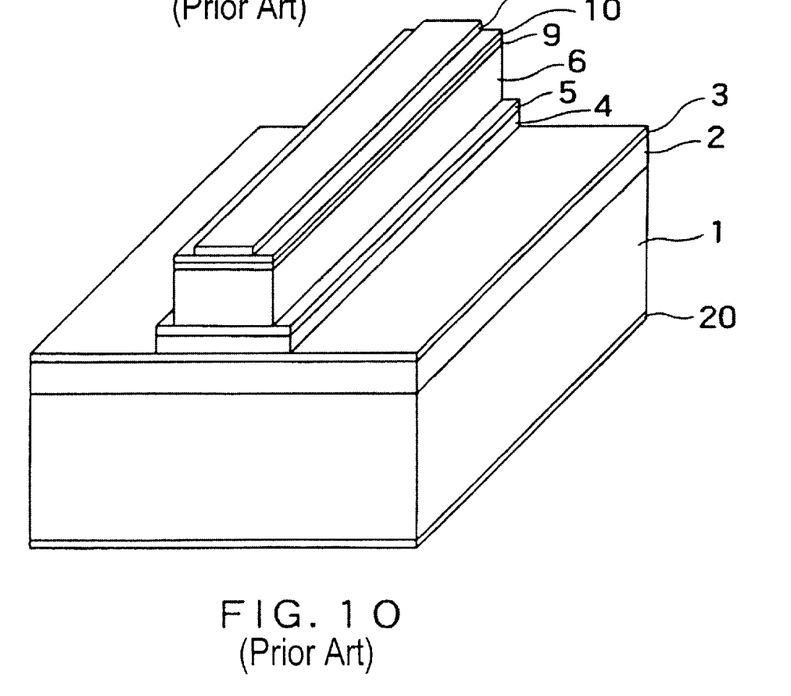
FIG. 10 is a perspective view showing an outline of the structure of a "stepped ridge waveguide".

FIG. 10 is a perspective view showing an outline of the structure of this "stepped ridge waveguide". In FIG. 10, the same reference numerals as in FIG. 9 denote the same parts explained above in connection with FIG. 9, and a detailed description thereof will be omitted.

When the first cladding layer 4 is slightly wider than and projects in the form of steps from the second cladding layer 6 as shown in FIG. 10, a margin for spread in the transverse mode is formed, so the transverse mode stabilizes. Since the first cladding layer 4 is patterned, the spread of a current in the lateral direction can also be suppressed.

It is, however, extremely difficult to symmetrically form the steps as shown in FIG. 10 with high controllability by a projection width of about 0.5 µm. The reason is that if common photolithography is used, it is difficult to symmetrically align a mask pattern with a ridge mesa in which steps are once formed.

SUMMARY OF THE INVENTION

The present invention has been made in consideration of the above problems, and has as its object to provide a waveguide optical device and a method of fabricating the same, which can easily implement a stepped ridge waveguide structure.

To achieve the above object, a waveguide optical device of the present invention is a waveguide optical device comprising a waveguide for guiding light, characterized in that the waveguide is a ridge waveguide in which a core layer is vertically sandwiched between cladding layers having a refractive index lower than that of the core layer, and one of upper cladding layers is formed into the shape of a mesa stripe, the upper cladding layers comprise at least a first cladding layer formed on the core layer, a first thin-film layer formed on the first cladding layer, a second thin-film layer formed on the first thin-film layer, and a second cladding layer formed on the second thin-film layer, steps are formed on the side surfaces of the mesa stripe such that the width of the mesa stripe increases in a lower portion close to the core layer, and the first thin-film layer is exposed to the steps.

The first and second cladding layers and the first and second thin-film layers are made of materials by which the rates of side etching from the side surfaces of the mesa stripe satisfy (second thin-film layer)>(first thin-film layer)>(first and second cladding layers) with respect to a first etchant, and satisfy (first and second cladding layers)>(first and second thin-film layers) with respect to a second etchant different from the first etchant. Accordingly, steps corresponding to a difference between the side etching amounts can be reliably formed.

A third cladding layer can be inserted between the first and second thin-film layers.

The first and second thin-film layers can also be stacked adjacent to each other. This further simplifies the device configuration and fabrication steps.

More specifically, the first and second cladding layers can be made of InP, and the first and second thin-film layers can be made of an InGaAlAsP-based compound semiconductor.

In this specification, an "InGaAlAsP-based compound semiconductor" includes all compositions within the ranges of $0 \leq x \leq 1$, $0 \leq y \leq 1$, $0 \leq z \leq 1$, and $0 \leq (x+y) \leq 1$ in a composition $In_xGa_yAl_{1-x-y}As_zP_{1-z}$.

A method of fabricating a waveguide optical device of the present invention is a method of fabricating a waveguide optical device having a ridge waveguide in which a core layer is vertically sandwiched between lower and upper cladding layers having a refractive index lower than that of the core layer, and one of the upper cladding layers is formed into the shape of a mesa stripe, characterized by comprising the steps of forming a core layer on a lower cladding layer, forming, as the upper cladding layers, a first cladding layer, first thin-film layer, second thin-film layer, and second cladding layer in this order on the core layer, patterning the upper cladding layers into the shape of a stripe, side-etching the first and second thin-film layers exposed to the side surfaces of the stripe, by using a first etchant by which the etching rate for the second thin-film layer is higher than that for the first thin-film layer, and etching the first and second cladding layers by using a second etchant by which the etching rate for the first and second cladding layers is higher than that for the first and second thin-film layers, thereby forming steps corresponding to a difference between the side etching amounts of the first and second thin-film layers, on the side surfaces of the mesa stripe.

In this method, fine steps of about 0.5 μm can be easily and reliably formed symmetrically on the right- and left-hand sides of the mesa stripe by properly selecting the materials of the first and second thin-film layers, the first etchant, and the etching conditions.

In the step of forming the upper cladding layers, a third cladding layer can be formed between the first and second thin-film layers.

The first and second cladding layers are made of InP, the first and second thin-film layers are made of an InGaAlAsP-based compound semiconductor, the first etchant is a sulfuric acid-based etchant, and the second etchant is a hydrochloric acid-based etchant. When this is the case, an InP-based waveguide optical device can be easily and reliably formed.

DESCRIPTION OF THE PREFERRED EMBODIMENTS

One point of the present invention is that first and second thin-film layers having different compositions are inserted into a cladding layer to be stepped, and steps corresponding to side etching amounts of these thin-film layers are formed. In this way, symmetrical steps of about 0.5 μm can be reliably and easily formed on the side surfaces of a ridge waveguide.

Embodiments of the present invention will be described in detail below with reference to practical examples.

First Embodiment

FIGS. 1A, 1B, 2A, and 2B are perspective views showing the major portions of the fabrication steps of a waveguide optical device according to the first embodiment of the present invention. That is, FIGS. 1A to 2B show the main portions of the fabrication steps of an InGaAsP-based laser formed on an n-type (100) InP substrate as an example of a waveguide optical device of the present invention. For the sake of simplicity, the InP substrate, electrodes, and the like are omitted from these drawings.

FIGS. 3A to 6 are sectional views showing these fabrication steps in more detail.

The fabrication steps will be described below with reference to these drawings.

Figure 3A:
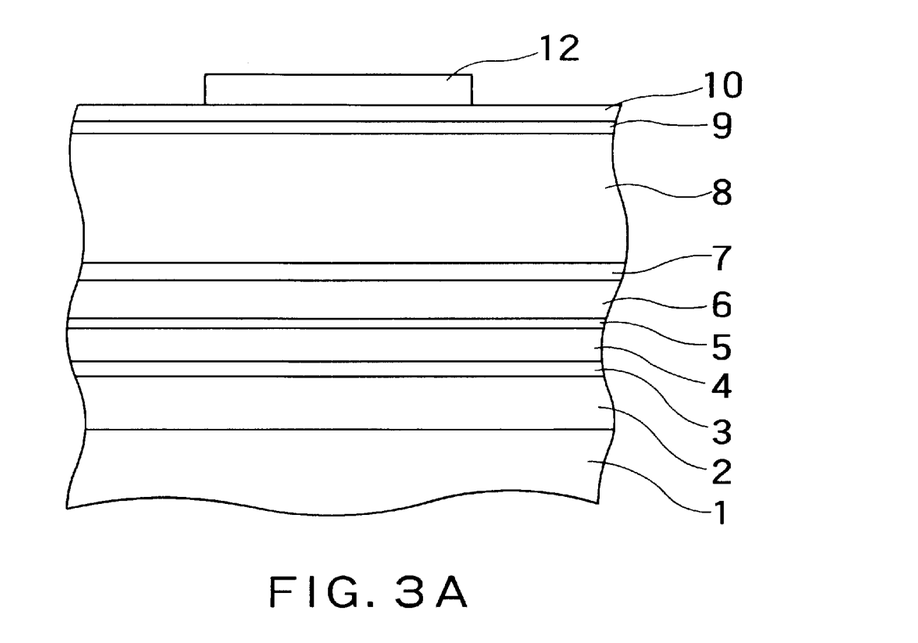
FIGS. 3A and 3B are sectional views showing the fabrication steps of the waveguide optical device according to the first embodiment of the present invention in more detail.

First, as shown in FIG. 3A, an n-InP lower cladding layer 2, an InGaAsP waveguide core layer 3 (about 0.1 µm thick) having an MQW structure, a p-InP first upper cladding layer 4 (about 0.15 µm thick), and a p-InGaAsP first mask layer 5 (about 0.05 µm thick) are grown on an n-type (100) InP substrate 1. The fabrication steps up to this point are substantially the same as the structures shown in FIGS. 9 and 10.

The composition of the first mask layer 5 has a bandgap corresponding to a wavelength of about 1.15 µm. One point of this embodiment is that InGaAsP having this composition has a relatively low side etching rate with respect to a sulfuric acid-based etchant.

As the crystal growth method of the present invention, it is possible to use various methods such as MOCVD (Metal Organic Chemical Vapor Deposition), MBE (Molecular Beam Epitaxy), and LPE (Liquid Phase Epitaxy).

In the same growth step, a p-InP second upper cladding layer 6 (about 0.2 µm thick), a p-InGaAsP second mask layer 7 (0.03 µm thick), a p-InP third upper cladding layer 8 (about 1.3 µm thick), a p-InGaAsP barrier buffer layer 9 (about 0.04 µm thick), and a $p^+$-InGaAs contact layer 10 (about 0.1 µm thick) are uniformly formed on the entire wafer surface by crystal growth.

To increase the side etching amount when a sulfuric acid-based etchant is used, the content of P (phosphorus) in the p-InGaAsP second mask layer 7 is decreased to give the layer the same composition as InGaAs or a composition close to InGaAs.

Subsequently, as shown in FIG. 3A, an $SiO_2$ mask 12 is formed on the stacked body thus obtained by crystal growth. This mask 12 is patterned into a stripe extending in the (011) direction.

Figure 3B:
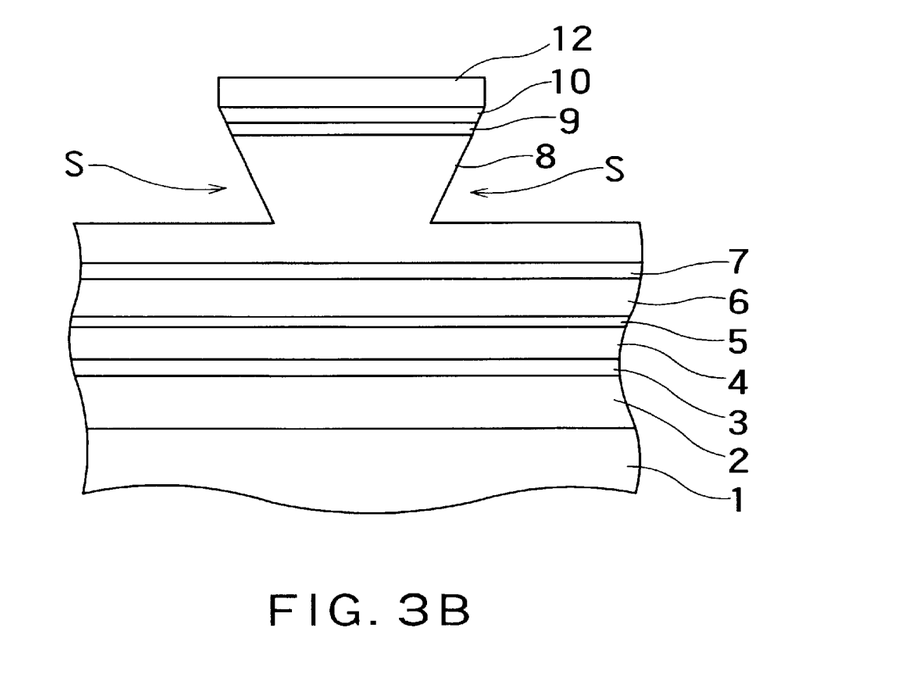

As shown in FIG. 3B, the $p^+$-InGaAs contact layer 10 and the p-InGaAsP barrier buffer layer 9 are etched, and the p-InP third upper cladding layer 8 (about 1.3 µm thick) is etched halfway. The etching method desirably has crystal orientation dependence. For example, wet etching using Br (bromine) methanol can be used. Side surfaces S of a mesa stripe formed by this etching are (111) A surfaces. That is, an "inverse mesa" which narrows downward is obtained.

Figure 4A:
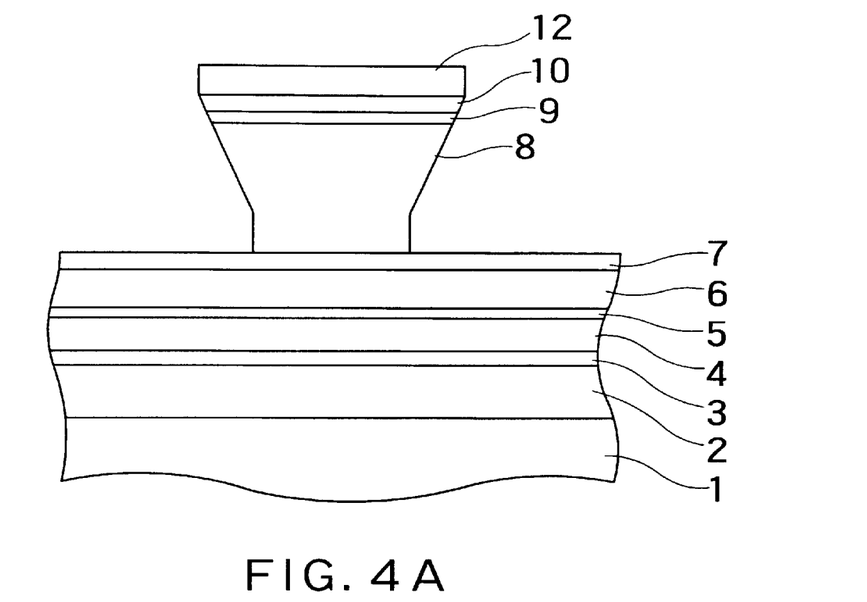
FIGS. 4A and 4B are sectional views showing the fabrication steps of the waveguide optical device according to the first embodiment of the present invention in more detail.

As shown in FIG. 4A, the residual portion of the cladding layer 8 is etched by a hydrochloric acid-based etchant. When a hydrochloric acid-based etchant is used for an InP-based material, the material is preferentially etched in the (100) direction. Accordingly, as shown in FIG. 4A, the portion can be removed substantially vertically from the bottom of the inverse mesa.

Figure 4B:
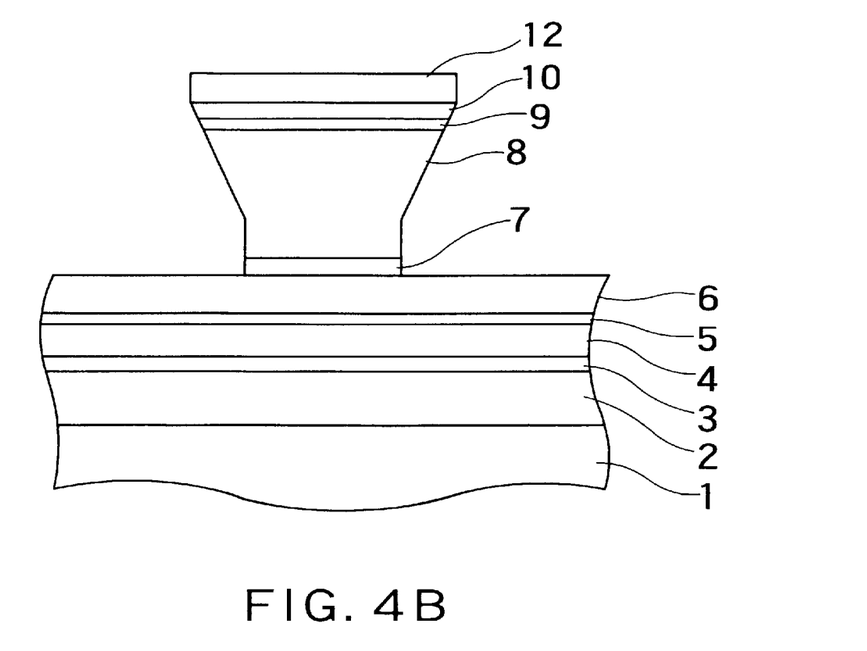

As shown in FIG. 4B, the second mask layer 7 is removed by a sulfuric acid-based etchant by adjusting the etching time so that the layer is not largely side-etched.

Figure 5A:
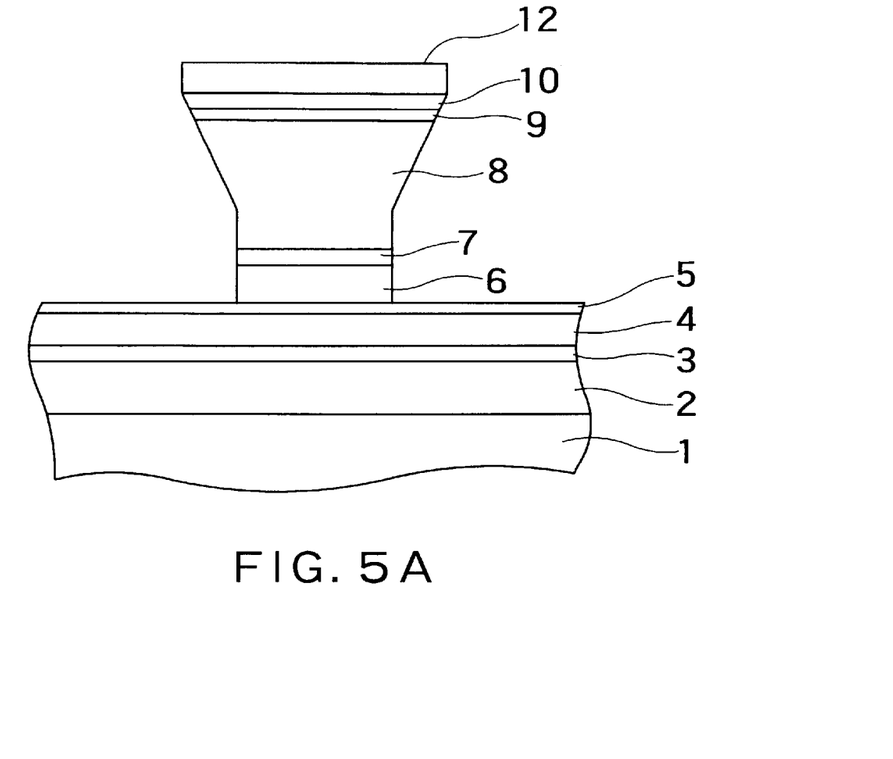
FIGS. 5A and 5B are sectional views showing the fabrication steps of the waveguide optical device according to the first embodiment of he present invention in more detail.

As shown in FIG. 5A, the second cladding layer 6 is again etched with a hydrochloric acid-based etchant to expose the p-InGaAsP first mask layer.

Figure 5B:
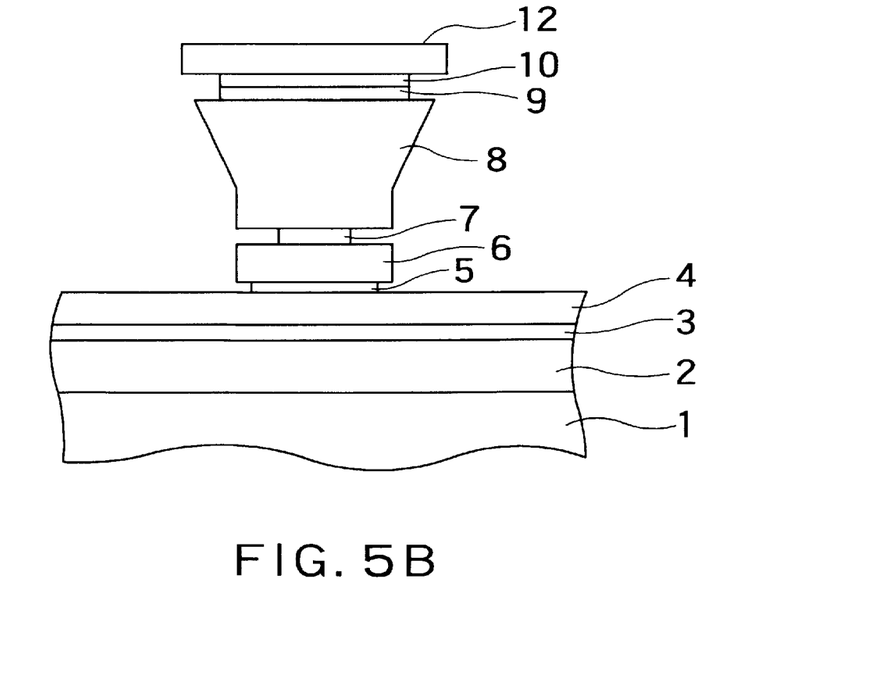

As shown in FIG. 5B, a sulfuric acid-based etchant is used to etch the first mask layer 5 while the etching time is so controlled that the second mask layer 7 and the first mask layer 5 are simultaneously side-etched by, e.g., 0.6 and 0.1 µm, respectively. By this etching, the $p^+$-InGaAs contact layer 10 and the p-InGaAsP barrier buffer layer 9 are also narrowed by side etching. However, a side etching amount of 0.6 µm on each of the right- and left-hand sides is not much of a problem since the upper surface of the inverse mesa is wide.

Although the cladding layers 6 and 8 are also slightly side-etched in some cases, the side etching amounts are slight and hence are not a problem.

Figure 1A:
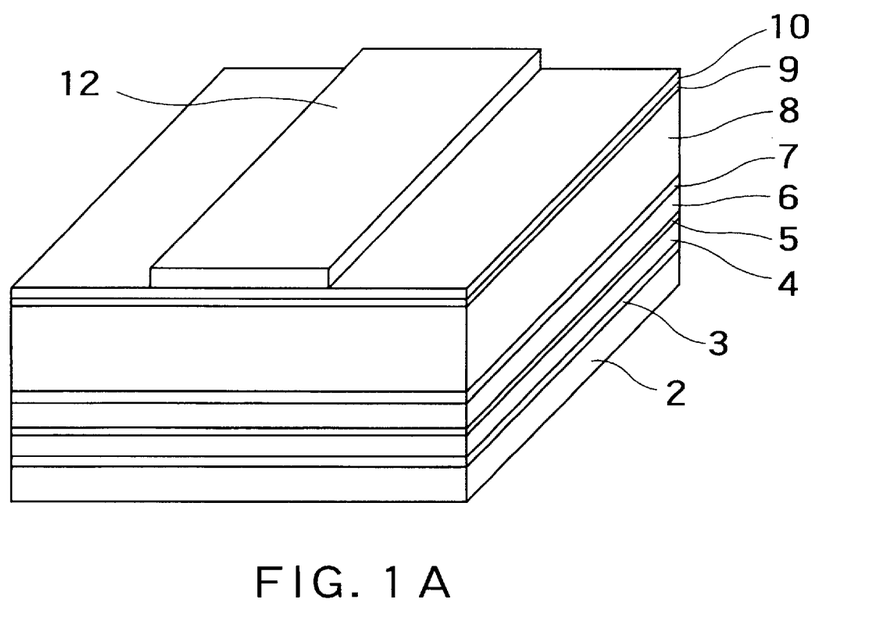
FIGS. 1A and 1B are perspective views showing the main portions of the fabrication steps of a waveguide optical device according to the first embodiment of the present invention.
Figure 1B:
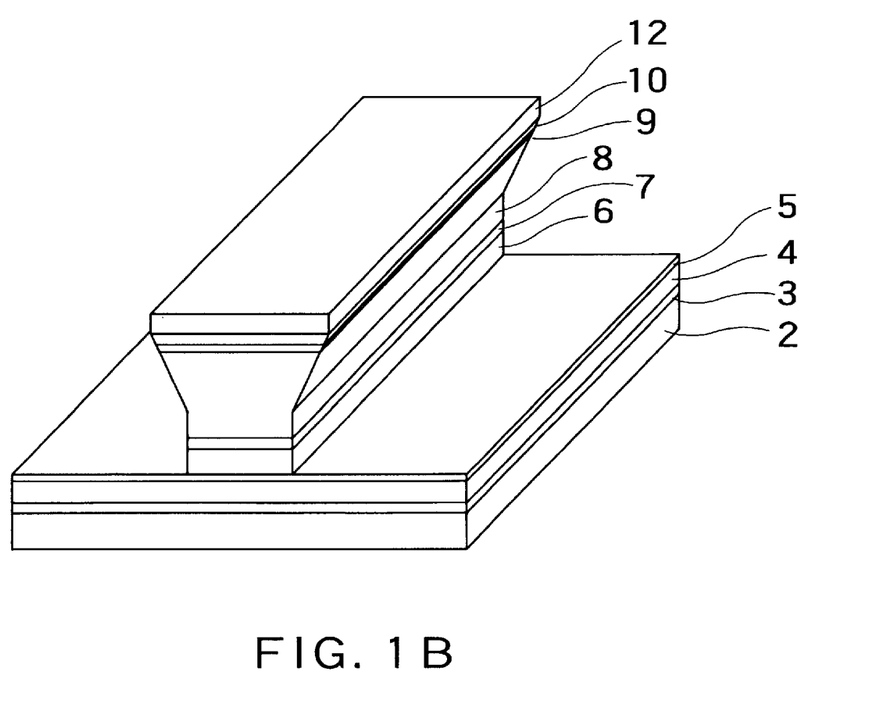
Figure 2A:
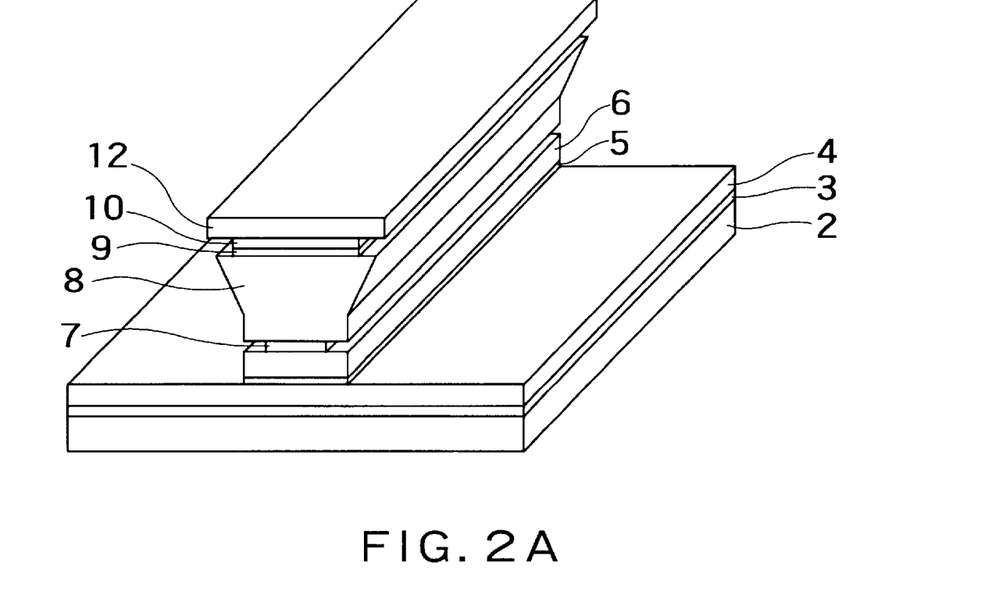
FIGS. 2A and 2B are perspective views showing the main portions of the fabrication steps of the waveguide optical device according to the firs embodiment of the present invention.
Figure 2B:
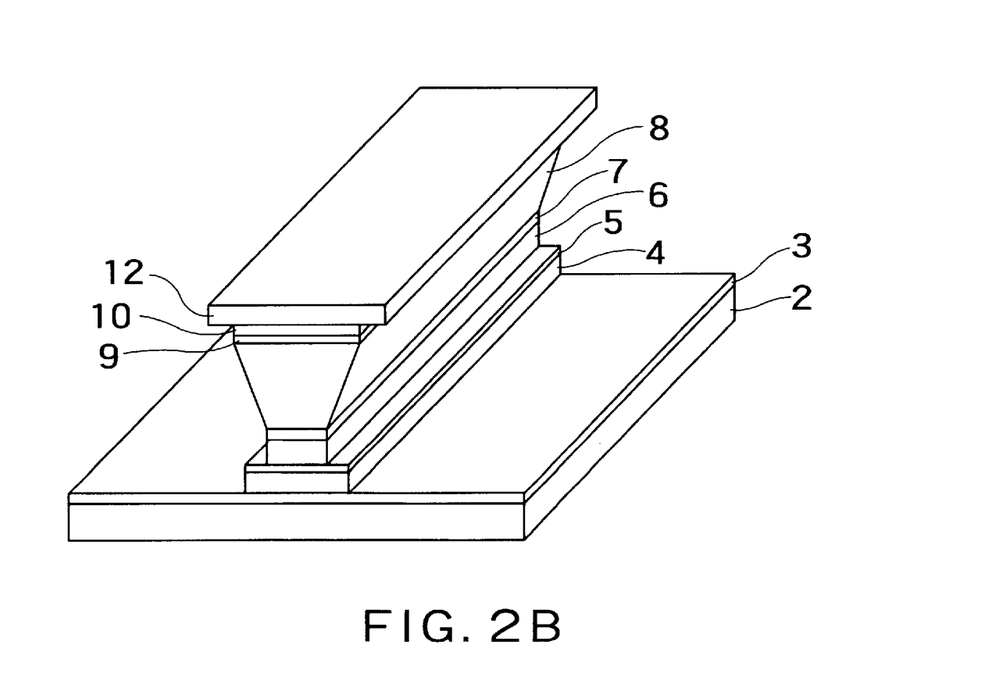
Figure 6:
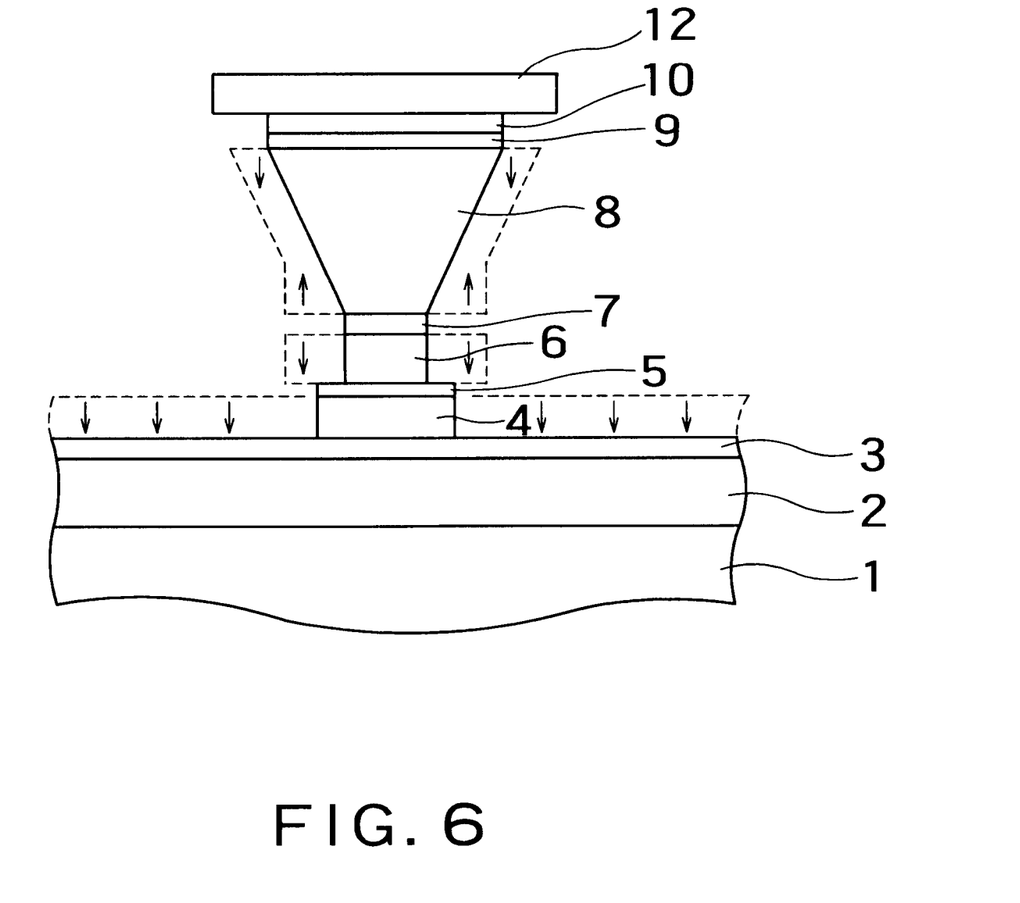
FIG. 6 is a sectional view showing the fabrication step of the waveguide optical device according to the first embodiment of the present invention more detail.

Subsequently, as shown in FIG. 6, a hydrochloric acid-based etchant is used to etch the third cladding layer 8, the second cladding layer 6, and the first cladding layer 4 by using the contact layer 10, the barrier buffer layer 9, the second mask layer 7, and the first mask layer 5 as masks. Referring to FIG. 6, the contours of the individual layers before the etching are represented by the dotted lines. When an InP layer is etched by using a hydrochloric acid-based etchant, the etching progresses principally in the <100> direction. The etching progressing directions are indicated by arrows in FIG. 6. When the etching thus progresses in the <100> direction, as shown in FIGS. 6 and 2B, the third cladding layer 8 is formed into the shape of an inverse mesa having continuous inclined surfaces. Also, the first cladding layer 4 is etched from its upper surface. The waveguide layer 3 is exposed as an etching stop layer, and the p-InP first upper cladding layer 4 remains in the form of steps. In this manner, a ridge waveguide having sub steps is completed.

After that, electrodes and the like are suitably formed by processes (not shown) to complete a waveguide optical device.

As described previously in connection with FIG. 10, the stepped ridge waveguide structure formed by the present invention has a large current focusing effect, a small junction capacitance, and high transverse mode stability.

In the present invention, it is possible to easily and reliably form this stepped ridge waveguide by using the orientation dependence of side etching and etching. That is, a plurality of mask layers having different side etching rates are properly formed and side-etched. After that, cladding layers are etched. In this way, steps having a projecting width of about 0.5 µm, which are difficult to obtain by photolithography, can be symmetrically formed with high controllability in a self-aligned manner.

Second Embodiment

The second embodiment of the present invention will be described below.

FIGS. 7A to 8B are perspective views showing the major portions of the fabrication steps of a waveguide optical device according to the second embodiment of the present invention. That is, these drawings also show the main portions of the fabrication steps of an InGaAsP-based laser formed on an n-type (100) InP substrate as an example of the waveguide optical device of the present invention. For the sake of simplicity, the InP substrate, electrodes, and the like are omitted from these drawings. In FIGS. 7A to 8B, the same reference numerals as in FIGS. 1A to 6 denote the same parts described previously in connection with FIGS. 1A to 6.

The fabrication steps of the waveguide optical device of this embodiment will be described below.

Figure 7A:
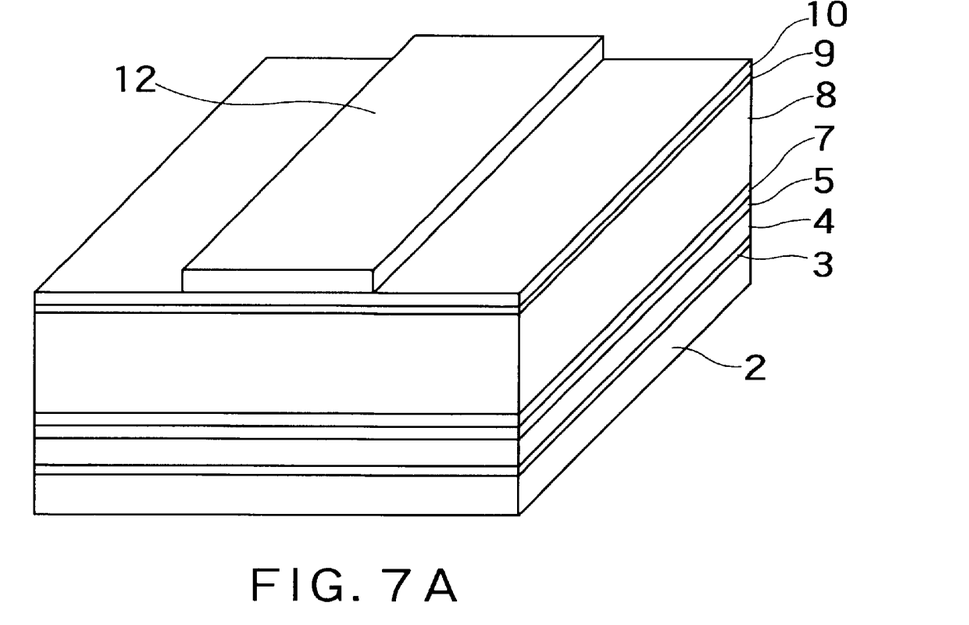
FIGS. 7A and 7B are perspective views showing the main portions of the fabrication steps of a waveguide optical device according to the second embodiment of the present invention.

First, as shown in FIG. 7A, an n-InP lower cladding layer 2, an InGaAsP waveguide core layer 3 (about 0.1 µm thick) having an MQW structure, a p-InP first upper cladding layer 4 (about 0.15 µm thick), a p-InGaAsP first mask layer 5 (about 0.05 µm thick), and a p-InGaAsP second mask layer 7 (0.03 µm thick) are grown on an n-type (100) InP substrate 1.

The difference from the first embodiment is that the first and second mask layers 5 and 7 having different side etching rates are successively grown. Since the intermediate layer (second cladding layer 6) is omitted, the subsequent etching steps simplify. As in the first embodiment, the composition of the first mask layer 5 can be InGaAsP corresponding to a wavelength of 1.15 μm, and the composition of the second mask layer 7 can be InGaAs or InGaAsP in which the content of phosphorus (P) is decreased.

As upper layers, a p-InP third upper cladding layer 8 (about 1.3 μm thick), a p-InGaAsP barrier buffer layer 9 (about 0.04 μm thick), and a p -InGaAs contact layer 10 (about 0.1 μm thick) are formed flat by crystal growth by the same growth step as in the first embodiment.

In addition, an $SiO_2$ mask 12 is formed, and the resultant stacked body is patterned into the shape of a stripe in the (011) direction. This step is analogous to the step previously described in connection with FIG. 3B. That is, the $p^+$-InGaAs contact layer 10 and the p-InGaAsP barrier buffer layer 9 are selectively removed in accordance with mask patterns by a sulfuric acid-based etchant. Furthermore, these layers are used as masks to etch the third cladding layer 8 with an HBr-based etchant ($HBr+H_2O$). Consequently, (111) A surfaces appear on the mesa stripe side surfaces. The process up to this point is similar to the process described above in connection with FIG. 3B.

Figure 7B:
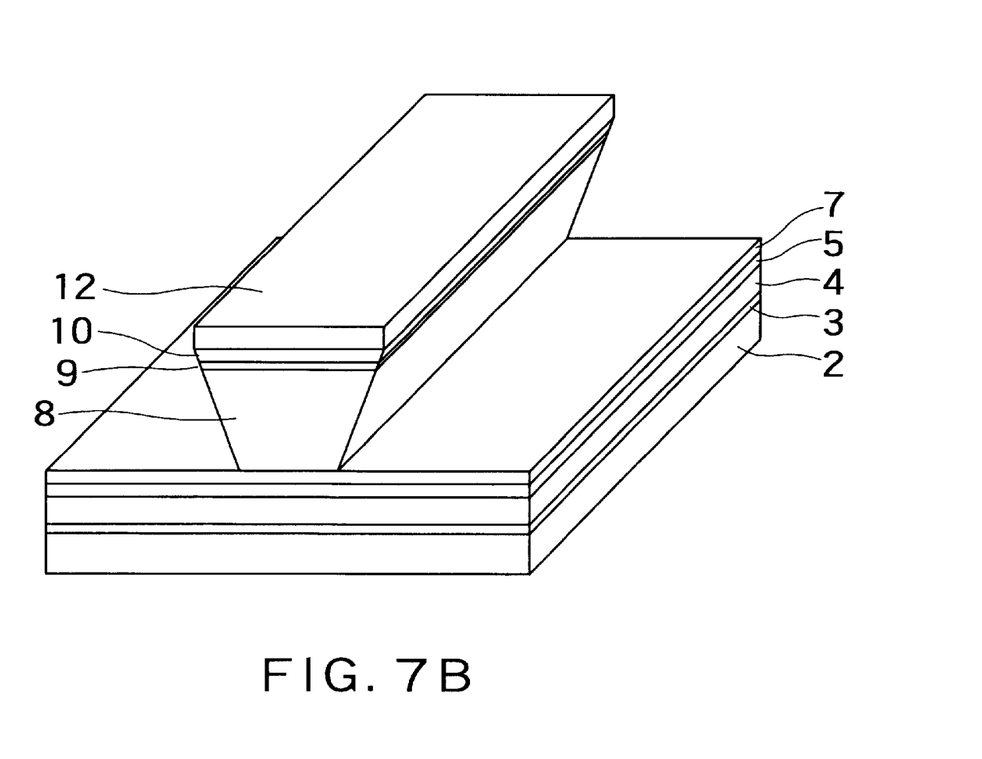

In this embodiment, however, as shown in FIG. 7B, during this etching, the third cladding layer 8 is etched until the second mask layer 7 is exposed as an etching stop layer.

Figure 8A:
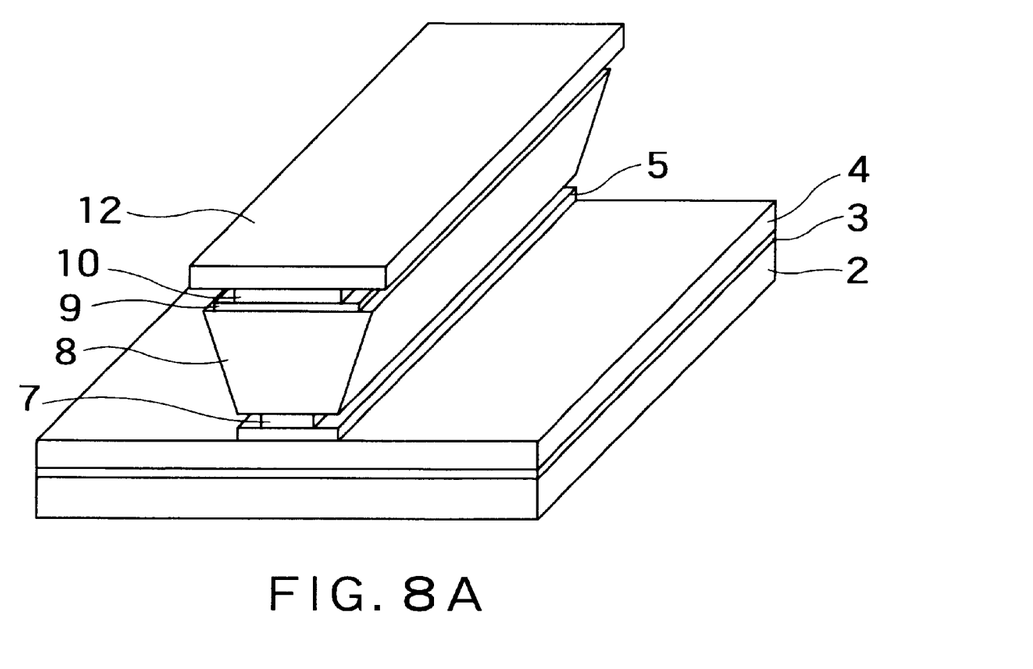
FIGS. 8A and 8B are perspective views showing the main portions of the fabrication steps of the waveguide optical device according to the second embodiment of the present invention.

As shown in FIG. 8A, the second mask layer 7 and the first mask layer 5 are simultaneously side-etched. As an etchant, a sulfuric acid-based wet etchant can be used as described previously. The etching time and etching temperature are so controlled that the second mask layer 7 and the first mask layer 5 are side-etched by, e.g., 0.6 and 0.1 μm, respectively. As described earlier, the compositions of these first and second mask layers are adjusted such that their etching rates are different.

Figure 8B:
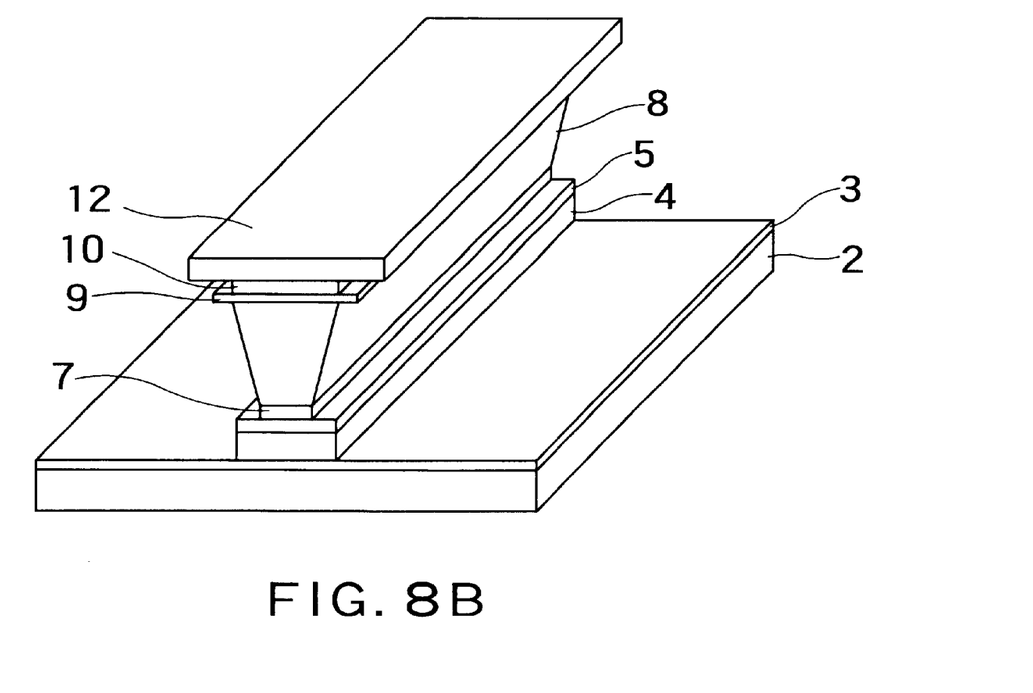

When a hydrochloric acid-based etchant is used by using the contact layer 10, the barrier buffer layer 9, the second mask layer 7, and the first mask layer 5 as masks, the waveguide layer 3 is exposed to the bottom surface as an etching stop layer. Consequently, as shown in FIG. 8B, a stepped ridge waveguide in which the p-InP second upper cladding layer 4 remains in the form of steps is obtained.

In this embodiment, two mask layers having different side etching amounts are stacked. This can simplify the etching steps more than in the first embodiment.

The embodiments of the present invention have been explained with reference to practical examples. However, the present invention is not limited to these practical examples. For example, if appropriate etchants exist, similar effects can be obtained by applying the present invention to waveguide optical devices made of various materials such as GaAs/AlGaAs, InGaAlP, InAlGaN, and ZnSe, in addition to the InGaAsP/InP described above.

Analogous effects can also be obtained by applying the present invention to various optical devices having a ridge waveguide, such as a waveguide light-receiving device and waveguide optical modulator, in addition to a semiconductor laser.

Furthermore, similar effects can be obtained by applying the present invention to an optical integrated circuit device fabricated by combining a light-emitting device and optical modulator, a light-emitting device and light-receiving device, or an optical modulator and light-receiving device.

As has been described in detail above, the present invention can easily and reliably form diverse optical devices having a stepped ridge waveguide which prevents the spread of current and reduces the junction capacitance by restricting the junction area, and by which the transverse mode is stable and readily controllable.

Consequently, the parasitic capacitance of a semiconductor laser or optical modulator reduces, and this makes a high-speed response of, e.g., 10 Gbps (Gigabits per second) feasible. It is also possible to realize a laser having a low oscillation threshold value and a stable transverse mode.

That is, the present invention makes it possible to provide various waveguide optical devices having simple arrangements and excellent performance, so the industrial merit of the invention is enormous.

What is claimed is:

1. A waveguide optical device comprising a waveguide for guiding light, wherein said waveguide is a ridge waveguide in which a core layer is vertically sandwiched between cladding layers having a refractive index lower than that of said core layer, and one of upper cladding layers is formed into the shape of a mesa stripe, said upper cladding layers comprise at least a first cladding layer formed on said core layer, a first thin-film layer formed on said first cladding layer, a second thin-film layer formed on said first thin-film layer, and a second cladding layer formed on said second thin-film layer, steps are formed on the side surfaces of said mesa stripe such that the width of said mesa stripe increases in a lower portion close to said core layer, and said first thin-film layer is exposed to said steps.

2. A device according to claim 1, wherein said first and second cladding layers and said first and second thin-film layers are made of materials by which the rates of side etching from the side surfaces of said mesa stripe satisfy (second thin-film layer)>(first thin-film layer)>(first and second cladding layers) with respect to a first etchant, and satisfy (first and second cladding layers)>(first and second thin-film layers) with respect to a second etchant different from said first etchant.

3. A device according to claim 2, wherein a third cladding layer is inserted between said first and second thin-film layers.

4. A device according to claim 3, wherein said first and second cladding layers are made of InP, and said first and second thin-film layers are made of an InGaAlAsP-based compound semiconductor.

5. A device according to claim 2, wherein said first and second thin-film layers are stacked adjacent to each other.

6. A device according to claim 5, wherein said first and second cladding layers are made of InP, and said first and second thin-film layers are made of an InGaAlAsP-based compound semiconductor.

7. A device according to claim 2, wherein said first and second cladding layers are made of InP, and said first and second thin-film layers are made of an InGaAlAsP-based compound semiconductor.

8. A device according to claim 1, wherein a third cladding layer is inserted between said first and second thin-film layers.

9. A device according to claim 8, wherein said first and second cladding layers are made of InP, and said first and second thin-film layers are made of an InGaAlAsP-based compound semiconductor.

10. A device according to claim 1, wherein said first and second thin-film layers are stacked adjacent to each other.

11. A device according to claim 10, wherein
said first and second cladding layers are made of InP, and
said first and second thin-film layers are made of an InGaAlAsP-based compound semiconductor.

12. A device according to claim 1, wherein
said first and second cladding layers are made of InP, and
said first and second thin-film layers are made of an InGaAlAsP-based compound semiconductor.

13. A method of fabricating a waveguide optical device having a ridge waveguide in which a core layer is vertically sandwiched between lower and upper cladding layers having a refractive index lower than that of said core layer, and one of said upper cladding layers is formed into the shape of a mesa stripe, comprising the steps of:
forming a core layer on a lower cladding layer;
forming, as said upper cladding layers, a first cladding layer, first thin-film layer, second thin-film layer, and second cladding layer in this order on said core layer;
patterning said upper cladding layers into the shape of a stripe;
side-etching said first and second thin-film layers exposed to the side surfaces of said stripe, by using a first etchant by which the etching rate for said second thin-film layer is higher than that for said first thin-film layer; and
etching said first and second cladding layers by using a second etchant by which the etching rate for said first and second cladding layers is higher than that for said first and second thin-film layers, thereby forming steps corresponding to a difference between the side etching amounts of said first and second thin-film layers, on the side surfaces of said mesa stripe.

14. A method according to claim 13, wherein in the step of forming said upper cladding layers, a third cladding layer is formed between said first and second thin-film layers.

15. A method according to claim 13, wherein
said first and second cladding layers are made of InP,
said first and second thin-film layers are made of an InGaAlAsP-based compound semiconductor,
said first etchant is a sulfuric acid-based etchant, and
said second etchant is a hydrochloric acid-based etchant.

16. A method according to claim 14, wherein
said first and second cladding layers are made of InP,
said first and second thin-film layers are made of an InGaAlAsP-based compound semiconductor,
said first etchant is a sulfuric acid-based etchant, and
said second etchant is a hydrochloric acid-based etchant.

* * * * *